US010287808B2

(12) United States Patent
Zhang

(10) Patent No.: US 10,287,808 B2
(45) Date of Patent: May 14, 2019

(54) ROTARY SHAFT

(71) Applicant: Lenovo (Beijing) Co., Ltd., Beijing (CN)

(72) Inventor: Xin Zhang, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 0 days.

(21) Appl. No.: 15/725,454

(22) Filed: Oct. 5, 2017

(65) Prior Publication Data
US 2018/0266154 A1 Sep. 20, 2018

(30) Foreign Application Priority Data
Mar. 15, 2017 (CN) .......................... 2017 1 0154355

(51) Int. Cl.
E05D 7/00 (2006.01)
F16C 11/04 (2006.01)
H05K 5/02 (2006.01)
E05D 3/18 (2006.01)
H05K 5/00 (2006.01)

(52) U.S. Cl.
CPC ................. *E05D 7/00* (2013.01); *E05D 3/18* (2013.01); *F16C 11/04* (2013.01); *H05K 5/0226* (2013.01); *E05Y 2900/606* (2013.01); *H05K 5/0017* (2013.01)

(58) Field of Classification Search
CPC ....... G06F 1/1652; G06F 1/1681; E05D 3/18; E05D 7/00
See application file for complete search history.

(56) References Cited

U.S. PATENT DOCUMENTS

| 4,995,144 | A | * | 2/1991 | Gateley | ................. | E04B 2/7431 16/261 |
| 7,082,196 | B2 | * | 7/2006 | Kauhaniemi | ....... | H04M 1/0214 379/433.13 |
| 8,151,501 | B2 | * | 4/2012 | Bemelmans | .......... | G06F 1/1601 40/603 |
| 8,713,759 | B2 | * | 5/2014 | Cai | ....................... | G06F 1/1681 16/366 |
| 8,813,312 | B2 | * | 8/2014 | Song | ..................... | G06F 1/1601 16/225 |

(Continued)

FOREIGN PATENT DOCUMENTS

| CN | 1875806 | A | 12/2006 |
| CN | 105065431 | A | 11/2015 |

(Continued)

*Primary Examiner* — Jeffrey O'Brien
(74) *Attorney, Agent, or Firm* — Anova Law Group, PLLC

(57) ABSTRACT

A rotation unit includes a first rotor, a second rotor coupled to the first rotor, and a third rotor coupled to the second rotor. The second rotor has reflection-symmetric structure, and the first rotor and the third rotor are reflection-symmetric to each other with respect to the second rotor. Each of the first rotor, the second rotor, and the third rotor includes one or more grooves and one or more pins. In response to the pins moving in the corresponding grooves, a length of a first face formed by inner faces of the first rotor, the second rotor, and the third rotor in the groove direction remains unchanged, and a length of a second face formed by outer faces of the first rotor, the second rotor, and the third rotor in the groove direction varies.

9 Claims, 5 Drawing Sheets

(56) References Cited

U.S. PATENT DOCUMENTS

| | | | | |
|---|---|---|---|---|
| 9,047,055 B2* | 6/2015 | Song | ................. | E05D 3/14 |
| 9,603,271 B2* | 3/2017 | Lee | ................. | H05K 5/0017 |
| 9,606,583 B2* | 3/2017 | Ahn | ................. | G06F 1/1641 |
| 9,869,114 B1* | 1/2018 | Hung | ................. | E05D 3/18 |
| 9,870,031 B2* | 1/2018 | Hsu | ................. | G06F 1/1681 |
| 9,898,051 B2* | 2/2018 | Cho | ................. | G06F 1/1616 |
| 9,915,981 B2* | 3/2018 | Hsu | ................. | G06F 1/1681 |
| 9,930,794 B2* | 3/2018 | Luan | ................. | H05K 5/0217 |
| 10,024,090 B2* | 7/2018 | Tazbaz | ................. | A45C 11/00 |
| 10,036,187 B2* | 7/2018 | Cheah | ................. | E05D 3/06 |
| 10,041,282 B2* | 8/2018 | Cheah | ................. | E05D 3/06 |
| 2012/0044620 A1* | 2/2012 | Song | ................. | G06F 1/1616 361/679.01 |
| 2012/0110784 A1* | 5/2012 | Hsu | ................. | G06F 1/1681 16/226 |
| 2012/0120618 A1* | 5/2012 | Bohn | ................. | G06F 1/1618 361/749 |
| 2012/0147542 A1* | 6/2012 | Kim | ................. | G06F 1/1601 361/679.28 |
| 2013/0318746 A1* | 12/2013 | Kuramochi | ................. | G06F 1/1681 16/342 |
| 2014/0007376 A1* | 1/2014 | Brewer | ................. | E05D 1/02 16/225 |
| 2014/0007377 A1* | 1/2014 | Masini | ................. | E05D 1/00 16/225 |
| 2014/0123436 A1* | 5/2014 | Griffin | ................. | H04M 1/0216 16/221 |
| 2017/0094775 A1* | 3/2017 | Fan | ................. | G06F 1/1652 |
| 2018/0136696 A1* | 5/2018 | Chen | ................. | H04M 1/0216 |
| 2018/0192528 A1* | 7/2018 | Lin | ................. | H05K 5/0217 |

FOREIGN PATENT DOCUMENTS

| | | |
|---|---|---|
| CN | 205180577 U | 4/2016 |
| JP | 2005090731 A | 4/2005 |

* cited by examiner $L2' > L2$

ROTARY SHAFT

CROSS-REFERENCE TO RELATED APPLICATION

This application claims priority to Chinese Application No. 201710154355.X, filed on Mar. 15, 2017, the entire contents of which are incorporated herein by reference.

FIELD OF THE DISCLOSURE

The present disclosure generally relates to the field of rotary shaft and, more particularly, to a rotary shaft suitable for a flexible display.

BACKGROUND

Some electronic devices can be bent for a certain degree of curvature, but cannot be arbitrarily stretched or squeezed, such as a flexible screen. For such electronic devices, the design of a rotary shaft requires that an inner length of the rotary shaft to remain constant and an outer size of the shaft can be increased or shortened. As such, an electronic device arranged at the inner face of the rotary shaft can be bent.

Therefore, a rotary shaft with a constant inner length and a variable outer size is needed.

SUMMARY

One aspect of the present disclosure provides a rotation unit including a first rotor, a second rotor coupled to the first rotor, and a third rotor coupled to the second rotor. The second rotor has a reflection-symmetric structure. The first rotor and the third rotor are reflection-symmetric to each other with respect to the second rotor. Each of the first rotor, the second rotor, and the third rotor includes one or more grooves and one or more pins. In response to the pins moving in the corresponding grooves, a length of a first face formed by an inner face of the first rotor, an inner face of the second rotor, and an inner face of the third rotor in the groove direction remains unchanged, and a length of a second face formed by an outer face of the first rotor, an outer face of the second rotor, and an outer face of the third rotor in the groove direction varies.

Another aspect of the present disclosure provides a rotary shaft including one or more rotation units.

Another aspect of the present disclosure provides a rotary shaft including a plurality of rotation units arranged in parallel.

DETAILED DESCRIPTION

In order to provide a more detailed understanding of the features and technical aspects of the embodiments of the present disclosure, embodiments of the present disclosure are described in detail in connection with the drawings, which are only provided to explain the present disclosure and are not intended to limit the present disclosure.

Figure 1:
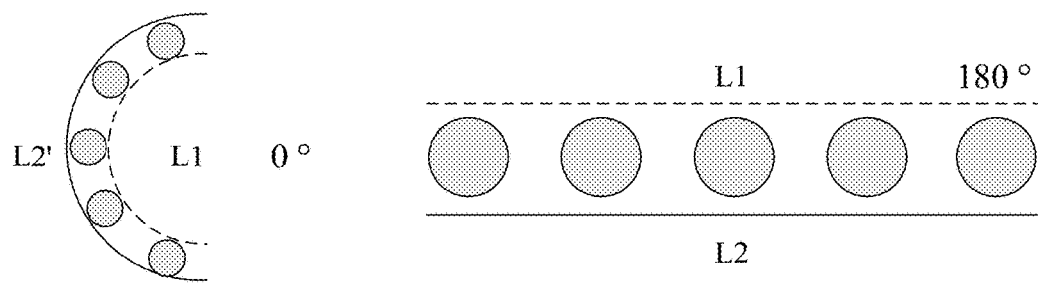
FIG. 1 is a schematic diagram of an example of rotary shaft according to the present disclosure.

FIG. 1 is a schematic diagram of an example of rotary shaft according to the present disclosure. In FIG. 1, the dashed line represents an inner face of the rotary shaft, and the solid line represents the outer face of the rotary shaft. The inner face of the rotary shaft may be provided with a bendable, but non-retractable material, such as a flexible display. The outer face of the rotary shaft may be provided with a bendable and retractable material, such as silica gel. The rotary shaft can be bent to a certain degree in a range from 0 degrees to 180 degrees. The right half of FIG. 1 shows the scenario in which the rotary shaft is at 180 degrees. In this scenario, the inner length of the rotary shaft is denoted by L1 and the outer length of the rotary shaft is denoted by L2. When the rotary shaft bends from 180 degrees to 0 degrees, the inner length of the rotary shaft remains unchanged, and the outer length of the rotary shaft is increased. The left half of FIG. 1 shows the scenario in which the rotary shaft is at 0 degrees. In this scenario, the inner length of the rotary shaft is denoted by L1 and the outer length of the rotary shaft is denoted by L2', where L2'>L2.

In order to realize the rotary shaft as shown in FIG. 1, the rotary shaft of the embodiments of the present disclosure may include one or more rotation units arranged in parallel. Each rotation unit may include a first rotor, a second rotor, and a third rotor. The second rotor may have a reflection-symmetric structure. The first rotor and the third rotor may be reflection-symmetric to each other with respect to the second rotor.

The first rotor, the second rotor, and the third rotor may be provided with corresponding groove structures and pin structures. Inner faces of the first, second, and third rotors form a first face, i.e., the inner face, of the rotation unit, and outer faces of the first, second, and third rotors form a second face, i.e., the outer face, of the rotation unit. When the pins are moving in the corresponding grooves, a length of the first face of the rotation unit in the groove direction can remain unchanged, and a length of the second face of the rotation unit in the groove direction can be varied.

Figure 2:
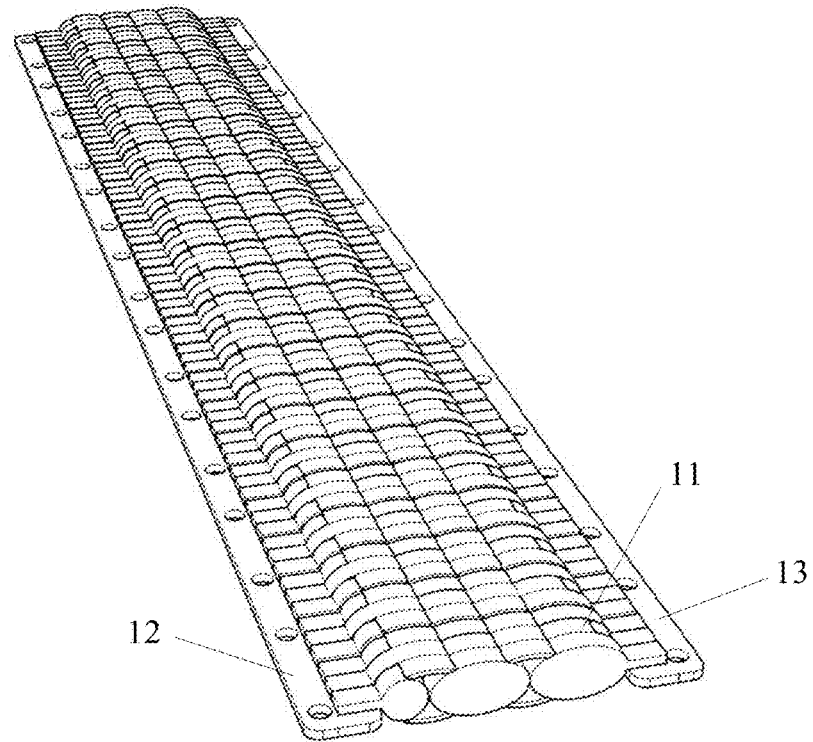
FIG. 2 is an overall morphological view of a rotary shaft at 180 degrees according to the present disclosure.
Figure 3:
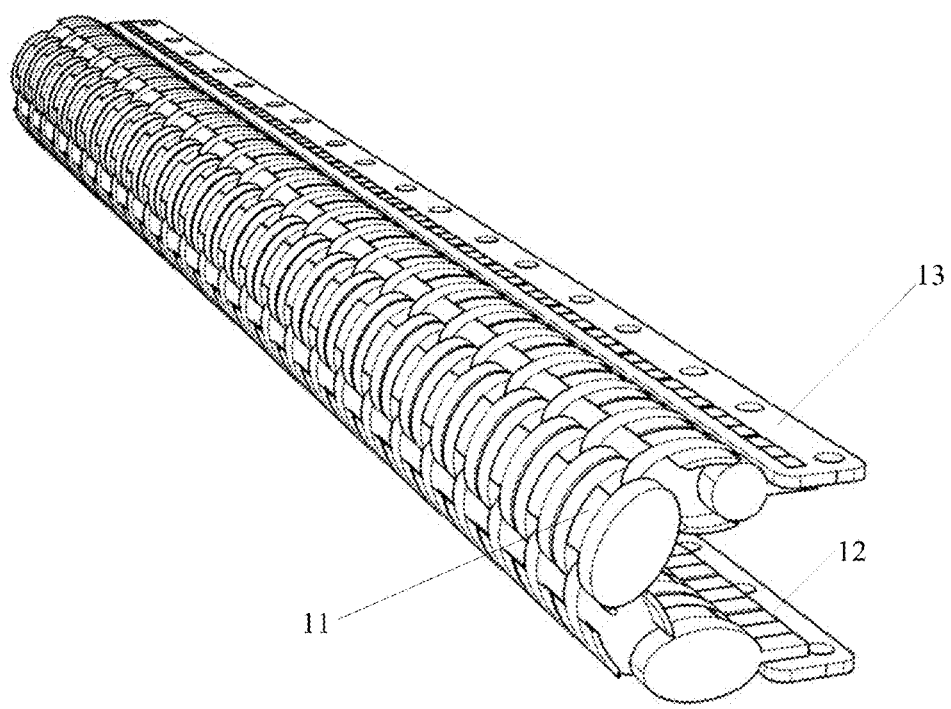
FIG. 3 is an overall morphological view of a rotary shaft at 0 degrees according to the present disclosure.

FIG. 2 is an overall morphological view of the rotary shaft at 180 degrees, and FIG. 3 is an overall morphological view of the rotary shaft at 0 degrees. As shown in FIGS. 2 and 3, the rotary shaft includes a plurality of rotation units 11. A length of the rotary shaft can be increased by assembling more rotation units 11 together. In practical applications, it is possible to form a desired number of rotation units as required. A plurality of rotation units may be arranged in parallel to form a rotary shaft of the present disclosure.

Hereinafter, an example of rotation unit according to the present disclosure is described. The rotation units included in the rotary shaft of the present disclosure may have a same or similar structure.

Figure 4:
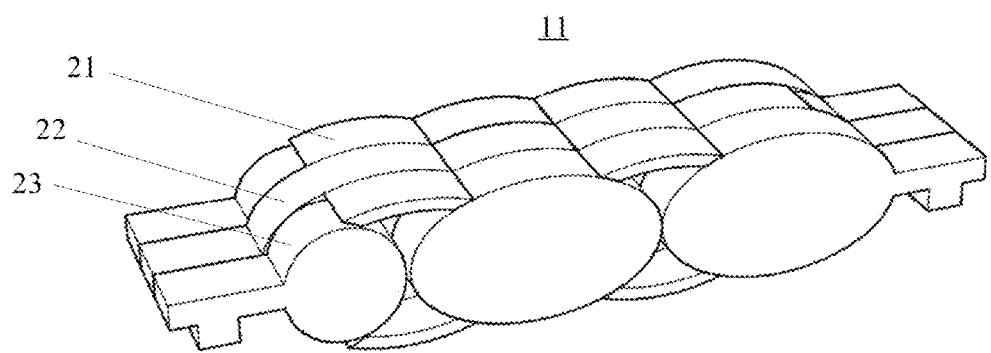
FIG. 4 is an overall morphological view of a rotation unit at 180 degrees according to the present disclosure.
Figure 5:
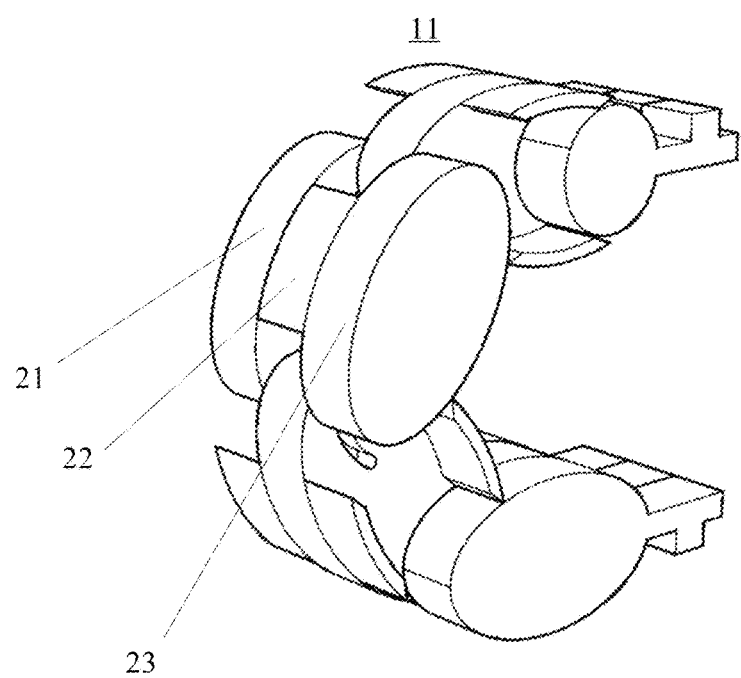
FIG. 5 is an overall morphological view of a rotation unit at 0 degrees according to the present disclosure.

FIG. 4 is an overall morphological view of the rotation unit 11, also referred to as a rotary shaft module at 180 degrees and FIG. 5 is an overall morphological view of the rotation unit 11 at 0 degrees. As shown in FIGS. 4 and 5, the rotation unit 11 includes a first rotor 21, a second rotor 22, and a third rotor 23. The second rotor 22 has a reflection-symmetric structure. The first rotor 21 and the third rotor 23 are reflection-symmetric to each other with respect to the second rotor 22. The entire rotation unit 11 is reflection-symmetric.

Figure 6:
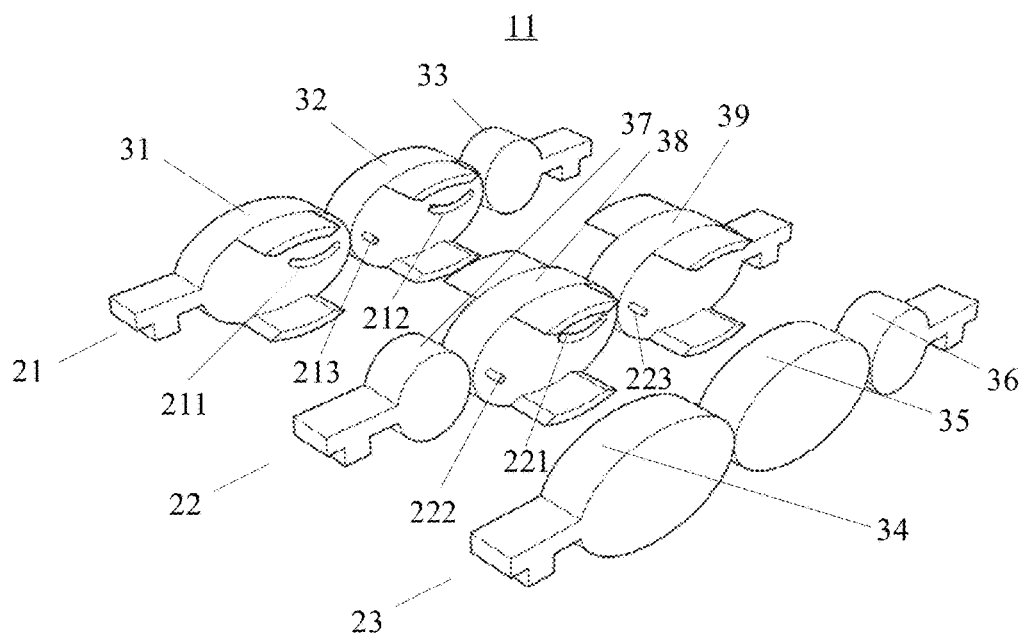
FIG. 6 is an exploded view of a rotation unit according to the present disclosure.

FIG. 6 is an exploded view of the rotation unit 11. As shown in FIG. 6, the first rotor 21, the second rotor 22, and the third rotor 23 are provided with corresponding groove structures and pin structures. Inner faces, also referred to as first faces, of the first rotor 21, the second rotor 22, and the third rotor 23 form a first face, i.e., the inner face, of the rotation unit 11, and outer faces, also referred to as second faces, of the first rotor 21, the second rotor 22, and the third rotor 23 form a second face, i.e., the outer face, of the rotation unit 11. When the pins are moving in the corresponding grooves, a length of the first face of the rotation unit 11 in the groove direction remains unchanged, and a length of the second face of the rotation unit 11 in the groove direction is varied. Therefore, the rotary shaft as shown in FIG. 1 can be obtained.

Specially, as shown in FIG. 6, a first groove 211, a second groove 212, and a first pin 213 are provided on a first side of the first rotor 21. A third groove 221, a second pin 222, and a third pin 223 are provided on a first side of the second rotor 22. A fourth groove (not shown), a fourth pin (not shown), and a fifth pin (not shown) are provided on a second side of the second rotor 22. In some embodiments, the structure on the first side of the second rotor 22 is reflection-symmetric to the structure on the second side of the second rotor 22.

A fifth groove (not shown), a sixth groove (not shown), and a sixth pin (not shown) are provided on a second side of the third rotor 23. In some embodiments, the structure on the second side of the third rotor 23 is reflection-symmetric to the structure on the first side of the first rotor 21.

Figure 7:
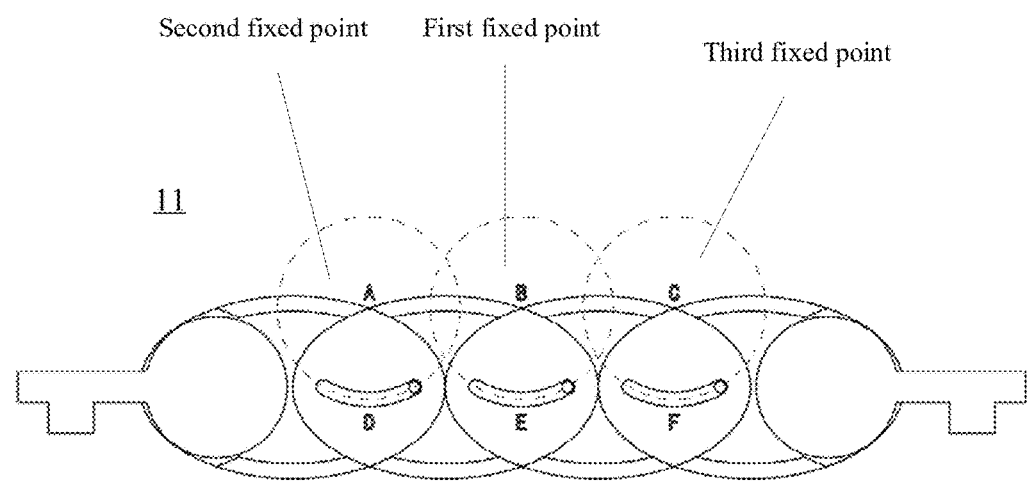
FIG. 7 is a schematic diagram of a rotation unit at 180 degrees according to the present disclosure.
Figure 8:
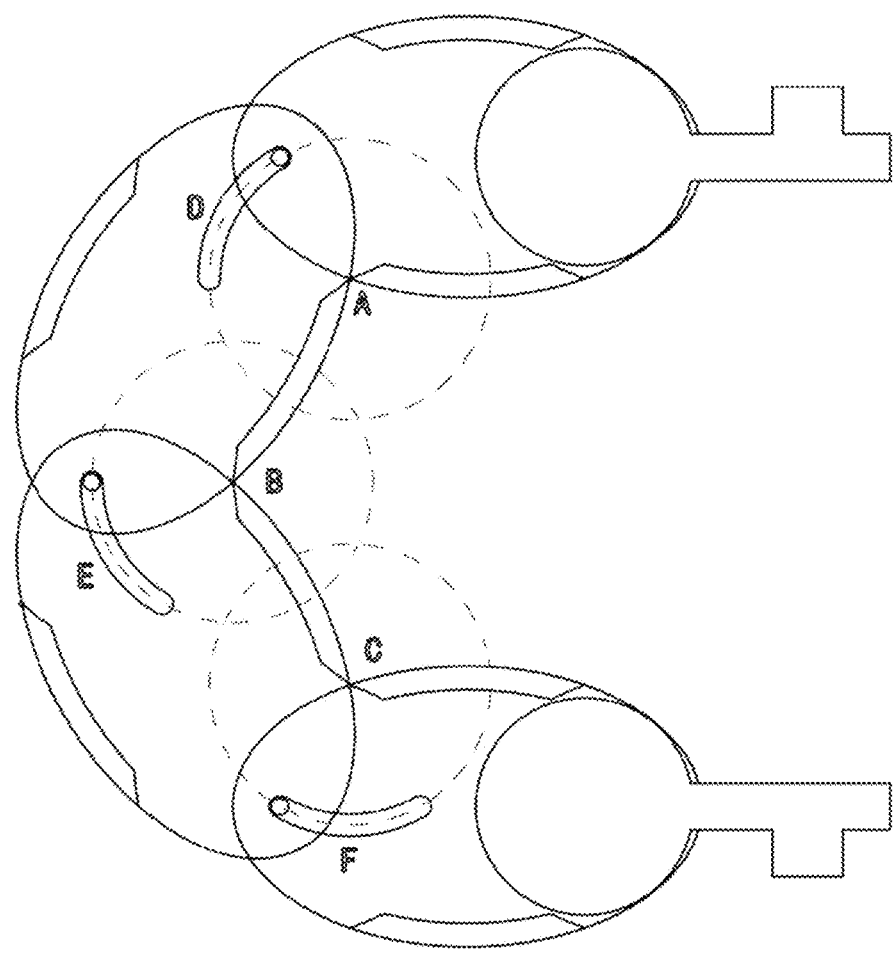
FIG. 8 is a schematic diagram of a rotation unit at 0 degrees according to the present disclosure.

The three rotors shown in FIG. 6 can be assembled to each other to form a rotation unit, and one or more such rotation units can be assembled to form a rotary shaft of the disclosure, such as the rotary shaft shown in FIG. 1. FIG. 7 is a schematic diagram of the rotation unit 11 at 180 degrees, and FIG. 8 is a schematic diagram of the rotation unit 11 at 0 degrees. As shown in FIGS. 7 and 8, the first pin 213 can move in the fourth groove to rotate about a first fixed point; the fourth pin can move in the first groove 211 to rotate about a second fixed point; the fifth pin can move in the second groove 212 to rotate about a third fixed point; the second pin 222 can move in the fifth groove to rotate about the second fixed point; the third pin 223 can move in the sixth groove to rotate about the third fixed point, and the sixth pin can move in the third groove 221 to rotate about the first fixed point.

In the above-mentioned scheme, the first fixed point corresponds to point B in FIGS. 7 and 8, the second fixed point corresponds to point A in FIGS. 7 and 8, and the third fixed point corresponds to point C in FIGS. 7 and 8. In the present disclosure, points A, B, and C are also referred to as "rotation stop points". Letters D, E, and F in the figures denote trajectories of corresponding pins during the rotation. In the process of rotating from 180 degrees to 0 degrees, the pins moves in corresponding grooves to rotate around the A, B, and C.

As shown in FIG. 6, the first rotor 21 includes a first interlocking member 31, a second interlocking member 32, and a third interlocking member 33.

The first groove 211 is provided on a first side of the first interlocking member 31, and the second groove 212 and the first pin 213 are provided on a first side of the second interlocking member 32. The first groove 211 has a curved shape, a circle center of which is on the second fixed point. The second groove 212 also has a curved shape, a circle center of which is on the third fixed point.

The third rotor 23 includes a fourth interlocking member 34, a fifth interlocking member 35, and a sixth interlocking member 36.

The fifth groove is provided on a second side of the fourth interlocking member 34, and the sixth groove and the sixth pin are provided on a second side of the fifth interlocking member 35. The fifth groove has a curved shape, a circle center of which is on the second fixed point, and the sixth groove has a curved shape, a circle center of which is on the third fixed point.

As shown in, e.g., FIG. 6, each of the first interlocking member 31 and the second interlocking member 32 includes a first sheet-like structure extending from the first side thereof towards the second side of the third rotor 23. The first sheet-like structure of the first interlocking member 31 and the first sheet-like structure of the second interlocking member 32 straddle one of the first face or the second face of the second rotor 22.

In some embodiments, as shown in, e.g., FIG. 6, each of the first interlocking member 31 and the second interlocking member 32 further includes a second sheet-like structure extending from the first side thereof towards the second side of the third rotor 23. The second sheet-like structure of the first interlocking member 31 and the second sheet-like structure of the second interlocking member 32 straddle the other one of the first face or the second face of the second rotor 22.

In some embodiments, each of the fourth interlocking member 34 and the fifth interlocking member 35 includes a second sheet-like structure extending from the second side thereof towards the first side of the first rotor 21. The second sheet-like structure of the fourth interlocking member 34 and the second sheet-like structure of the fifth interlocking member 35 straddle the other one of the first face or the second face of the second rotor 22. That is, in these embodiments, instead of arranging both the first and second sheet-like structures on the first rotor 21, the first and second sheet-like structures are arranged on the first rotor 21 and the third rotor 23, respectively.

Further, as shown in, e.g., FIG. 6, the second rotor 22 includes a seventh interlocking member 37, an eighth interlocking member 38, and a ninth interlocking member 39.

The third groove 221 and the second pin 222 are provided on a first side of the eighth interlocking member 38, the third pin 223 is provided on a first side of the ninth interlocking member 39. The third groove 221 has a curved shape, a circle center of which is on the first fixed point.

The fourth groove and the fourth pin are provided on a second side of the eighth interlocking member 38, and the fifth pin is provided on a second side of the ninth interlocking member 39. The fourth groove has a curved shape, a circle center of which is on the first fixed point.

In some embodiments, each of the eighth interlocking member 38 and the ninth interlocking member 39 includes a first sheet-like structure extending from the second side thereof. The first sheet-like structures of the eighth interlocking member 38 and the ninth interlocking member 39 straddle one of the first face or the second face of the first rotor 21.

Further, each of the eighth interlocking member 38 and the ninth interlocking member 39 includes a second sheet-like structure extending from extend the first side thereof. The second sheet-like structures of the eighth interlocking member 38 and the ninth interlocking member 39 straddle one of the first face or the second face of the third rotor 23.

Referring again to FIGS. 2 and 3, a first protrusion structure of each rotary unit 11 in the rotary shaft is inserted into a first end bracket 12, and a second protrusion structure of each rotary unit 11 in the rotary shaft is inserted into a second end bracket 13. Thus, through the first end bracket 12 and the second end bracket 13, all of the rotation units 11 of the rotary shaft are arranged in parallel.

In some embodiments, an interference component is provided in each groove, through which friction torque can be generated for the rotary shaft.

In the situation where the technical solutions described in the present disclosure are not conflicting, they can be arbitrarily combined.

The foregoing is merely a description of embodiments of the present disclosure and is not intended to limit the scope of the disclosure. Any person skilled in the art will appreciate that variations or substitutions are intended to be within the scope of the present disclosure.

What is claimed is:

1. A rotation unit comprising:
a first rotor;
a second rotor coupled to the first rotor; and
a third rotor coupled to the second rotor,
wherein:
the second rotor has a reflection-symmetric structure;
the first rotor and the third rotor are reflection-symmetric to each other with respect to the second rotor;
each of the first rotor, the second rotor, and the third rotor includes one or more grooves and one or more pins; and
in response to the pins moving in the corresponding grooves, a length of a first face formed by an inner face of the first rotor, an inner face of the second rotor, and an inner face of the third rotor in a groove direction remains unchanged, and a length of a second face formed by an outer face of the first rotor, an outer face of the second rotor, and an outer face of the third rotor in the groove direction varies.

2. The rotation unit according to claim 1, wherein:
the one or more grooves of the first rotor include a first groove and a second groove arranged on a first side of the first rotor, and the one or more pins of the first rotor include a first pin arranged on the first side of the first rotor;
the one or more grooves of the second rotor include a third groove arranged on a first side of the second rotor and a fourth groove arranged on a second side of the second rotor opposite to the first side of the second rotor, and the one or more pins of the second rotor include a second pin and a third pin arranged on the first side of the second rotor and a fourth pin and a fifth pin arranged on the second side of the second rotor;
the one or more grooves of the third rotor include a fifth groove and a sixth groove arranged on a second side of the third rotor, and the one or more pins of the third rotor include a sixth pin arranged on the second side of the third rotor; and
in response to bending the rotation unit, the first pin moves in the fourth groove to rotate about a first fixed point, the fourth pin moves in the first groove to rotate about a second fixed point, the fifth pin moves in the second groove to rotate about a third fixed point, the second pin moves in the fifth groove to rotate about the second fixed point, the third pin moves in the sixth groove to rotate about the third fixed point, and the sixth pin moves in the third groove to rotate about the first fixed point.

3. The rotation unit according to claim 2, wherein:
the first rotor includes a first interlocking member, a second interlocking member, and a third interlocking member, wherein:
the first groove is arranged on a first side of the first interlocking member;
the second groove and the first pin are arranged on a first side of the second interlocking member;
the first groove has a curved shape, a circle center of the first groove being on the second fixed point, and
the second groove has a curved shape, a circle center of the second groove being on the third fixed point; and
the third rotor includes a fourth interlocking member, a fifth interlocking member, and a sixth interlocking member, wherein:
the fifth groove is arranged on a second side of the fourth interlocking member;
the sixth groove and the sixth pin are arranged on the second side of the fifth interlocking member;
the fifth groove has a curved shape, a circle center of the fifth groove being on the second fixed point; and
the sixth groove has a curved shape, a circle center of the sixth groove being on the third fixed point.

4. The rotation unit according to claim 3, wherein:
the first interlocking member includes a sheet structure extending from the first side of the first interlocking member and straddling one of the inner face or the outer face of the second rotor; and
the second interlocking member includes a sheet structure extending from the first side of the second interlocking member and straddling the one of the inner face or the outer face of the second rotor.

5. The rotation unit according to claim 3, wherein:
the second rotor includes a seventh interlocking member, an eighth interlocking member, and a ninth interlocking member;
the third groove and the second pin are arranged on a first side of the eighth interlocking member, the third groove having a curved shape and a circle center of the third groove being on the first fixed point;
the third pin is arranged on a first side of the ninth interlocking member;
the fourth groove and the fourth pin are arranged on a second side of the eighth interlocking member, the fourth groove having a curved shape and a circle center of the third groove being on the first fixed point; and
the fifth pin is arranged on a second side of the ninth interlocking member.

6. The rotation unit according to claim 5, wherein:
the eighth interlocking member includes:
a sheet structure extending from the second side of the eighth interlocking member and straddling one of the inner face or the outer face of the first rotor, and
another sheet structure extending from the first side of the eighth interlocking member and straddling one of the inner face or the outer face of the third rotor, and
the ninth interlocking member includes:
a sheet structure extending from the second side of the ninth interlocking member and straddling the one of the inner face or the outer face of the first rotor, and
another sheet structure extending from the first side of the ninth interlocking member and straddling the one of the inner face or the outer face of the third rotor.

7. The rotation unit according to claim 1, further comprising:
   a first protrusion structure for inserting into a first end bracket; and
   a second protrusion structure for inserting into a second end bracket.

8. A rotary shaft comprising one or more rotation units according to claim 1.

9. A rotary shaft comprising a plurality of rotation units according to claim 1, wherein the plurality of rotation units are arranged in parallel.

\* \* \* \* \*